United States Patent
Noguchi et al.

(10) Patent No.: US 6,432,757 B1
(45) Date of Patent: Aug. 13, 2002

(54) METHOD OF MANUFACTURING LIQUID CRYSTAL DISPLAY PANEL BY POLY-CRYSTALLIZING AMORPHOUS SILICON FILM USING BOTH A LASER AND LAMP LIGHTS

(75) Inventors: Takashi Noguchi; Setsuo Usui, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/639,418

(22) Filed: Aug. 14, 2000

(30) Foreign Application Priority Data

Aug. 13, 1999 (JP) .............................. 11-229046

(51) Int. Cl.[7] .......................... H01L 21/00; H01L 21/84; H01L 21/20; H01L 21/36
(52) U.S. Cl. ........................... 438/166; 438/30; 438/486
(58) Field of Search ................................. 438/166, 149, 438/164, 30, 22, 482, 486

(56) References Cited

U.S. PATENT DOCUMENTS

| | | | |
|---|---|---|---|
| 5,365,080 A | * 11/1994 | Yamazaki et al. | 257/66 |
| 5,817,548 A | * 10/1998 | Noguchi et al. | 438/160 |
| 6,031,249 A | * 2/2000 | Yamazaki et al. | 257/66 |
| 6,136,632 A | * 10/2000 | Higashi | 438/166 |

OTHER PUBLICATIONS

I. Asai et al., "A Fabrication of Homogenious Poly–Si TFT's Using Excimer Laser Annealing," Extended Abst. Int. Conf. on Solid State Devices and Materials, Tsukuba, pp. 55–57 (1992).

C. Prat et al., "1 Hz/15 Joules–excimer–laser development for flat panel display applications," Paper 21–3 presented at SID' 99 Conference, San Jose, CA, U.S.A. (May, 1999).

T. Noguchi et al., "Comparison of Effects Between Large–Area–Beam ELA and SPC on TFT Characteristics," IEEE Trans. On Electron Devices, 43:1454–58 (1996).

K.H. Lee et al., "Gigantic Crystal Grain by Excimer Laser with Long Pulse Duration of 200 ns and Application to TFT," Abstract A27 presented at ISPSA–98, Seoul, Korea (1998).

K.H. Lee et al., "Gigantic Crystal Grain by Excimer Laser with a Pulse Duration of 200 ns and Its Application to TFT," J. Kor. Phys. Soc., 34:S268–71 (Jun., 1999).

* cited by examiner

Primary Examiner—Richard Elms
Assistant Examiner—Adam Pyonin
(74) Attorney, Agent, or Firm—Sonnenschein, Nath & Rosenthal

(57) ABSTRACT

Provided is a method of manufacturing a monolithic liquid crystal display panel with a large area and high-image quality. A protecting film and an amorphous silicon film are sequentially formed on an insulating substrate. Annealing is performed on a region intended for pixel area formation by irradiating ultraviolet rays by a ultraviolet ray lamp, whereas annealing is performed on a region intended for horizontal scan area formation and a region intended for vertical scan area formation by irradiating an excimer laser at the same time, respectively. Thus obtained polycrystalline silicon film formed on the region intended for pixel area formation has uniform crystal grains while polycrystalline silicon films formed on the region intended for horizontal scan area formation and the region for vertical scan area formation have larger crystal grains. Thin-film transistors are formed in these regions, respectively. Accordingly, a monolithic liquid crystal display panel with a large area and high-image quality is manufactured.

2 Claims, 3 Drawing Sheets

METHOD OF MANUFACTURING LIQUID CRYSTAL DISPLAY PANEL BY POLY-CRYSTALLIZING AMORPHOUS SILICON FILM USING BOTH A LASER AND LAMP LIGHTS

RELATED APPLICATION DATA

The present application claims priority to Japanese Application No. P11-229046 filed Aug. 13, 1999, which application is incorporated herein by reference to the extent permitted by law.

BACKGROUND OF THE INVENTION

1. Field of the Invention

The present invention relates to a method of manufacturing a liquid crystal display panel in which devices such as a transistor comprising a display area and a peripheral circuit area are formed on a polycrystalline semiconductor film.

2. Description of the Related Art

In recent years, a display device with large size, fine definition and high-image quality display has been sought. Responding to these needs, an active matrix type liquid crystal display device in which a thin-film transistor (TFT) is employed as a switching device for driving liquid crystal is used as a liquid crystal display (LCD).

As TFT's used in this liquid crystal display, there exists a TFT in which amorphous silicon is used for a channel region comprising an active layer and a TFT in which polycrystalline silicon is used for the channel region. The TFT using the polycrystalline silicon has lower on-state resistance than the TFT using the amorphous silicon and shows high responsivity and driving ability. Thus, this type of TFT is expected to realize large size, fine definition and high-image quality display.

As a method of forming the polycrystalline silicon layer, an excimer laser annealing (ELA) method for irradiating an excimer laser onto the amorphous silicon and a rapid thermal annealing (RTA) method for irradiating ultraviolet rays thereon are well known.

There is an ELA method called as a multi-scan-shot annealing method. In this method, energy beams are irradiated on a region intended for irradiation in line to crystallize the region. However, heretofore it has been pointed out that this method has the following problems (I. Asai, N. Kato, M. Fuse, and H. Hamano, "A fabrication of homogenious poly-Si TFT's using excimer laser annealing", in Extended Abst. Int. Conf. on Solid State Devices and Materials, Tsukuba, pp.55–57, 1992). First, it is difficult to irradiate uniform energy beams in a scan direction (horizontal direction). Second, since energy beams are so fine it takes time to irradiate on a large area, thereby decreasing throughput. Third, between neighboring irradiation regions there exists an area which is irradiated by energy beams more than once, whereby the crystal grains become non-uniform.

In recent years, however, an ELA method using high-power energy beams, 10 J and over has been developed (C. Prat, M. Stehle, and D. Zahorski, "1 Hz/15 Jules-excimer-laser development for flat panel display applications.", SID'99, To be presented.). Large-area ELA is prominent as the ELA method. The large-area ELA is a method of irradiating energy beams on the whole area at the same time (T. Noguchi, T. Ogawa, Y. Ikeda, "Method of forming polycrystalline silicon layer on substrate by large area excimer laser irradiation", U.S. Pat. No. 5,529,951, Jun. 25, 1996; T. Noguchi et al., IEEE Trans. On Electron Device, Vol. 43, pp. 1454–1458, 1996). By irradiating high-power energy beams on an amorphous silicon film, a polycrystalline silicon film with larger crystal grains is formed, so that TFT's with high carrier mobility are formed (K. H. Lee et al., Gigantic crystal grain by excimer laser with long pulse duration of 200 ns and application to TFT, presented in ISPSA-98. Seoul) and TFT's in which threshold hardly varies are formed (T. Noguchi, "The effect of annealing at a high temperature for short time on micro-poly Si TFT (ELA and RTA)", IEICE Technical Report, SDM92-171, 1992-03).

On the other hand, since silicon films tend to absorb ultraviolet rays (UV), annealing is performed by irradiating ultraviolet rays on an amorphous silicon film in the RTA method (J. Mehlhaff, and J. Fair, AMLCD '93, 1993). In this annealing method light sources of ultraviolet rays are lined up and belt-like ultraviolet rays are uniformly irradiated on the irradiation area of the amorphous silicon film. Thus, a polycrystalline silicon film having uniform crystal grains is obtained.

The active matrix type LCD includes a horizontal scan area (horizontal scan circuit; signal electrode driving circuit), a vertical scan area (vertical san circuit; scan electrode driving circuit), and a pixel area. With a monolithic liquid crystal display panel in which the horizontal scan area, vertical scan area, and pixel area are formed on a substrate, it is required that TFT's with high mobility are formed in the peripheral circuit area, particularly, in the horizontal scan area, and TFT's with a large area and uniform properties are formed in the pixel area.

However, the aforementioned annealing methods have the following problems, respectively. With the large-area ELA, the area of the amorphous silicon film which can be crystallized by irradiating one shot of pulse energy beams is limited. For instance, when a whole amorphous silicon film of 20 cm by 10 cm is to be crystallized, supposing energy density necessary for crystallization is 200 mJ/cm$^2$, 200× 20×10=40 J which exceeds performance capabilities of the current laser apparatus. The problem that exists in the large-area ELA is that in order to poly-crystallize the amorphous silicon film of a region of 10 inches or over, necessary energy is insufficient and the load necessary for large-area irradiation on the optical apparatus increases.

Therefore, in order to irradiate high-power energy beams on a substrate to poly-crystallize across a large area, the high-power energy beams need to be multi-shot irradiated while shifting the irradiation area. For example, assuming that crystallization of the amorphous silicon film of 50 cm$^2$ by irradiating one shot of high-power energy beams is possible, in order to crystallize the whole amorphous silicon film of 20 cm by 10 cm, four shots of irradiation of the high-power energy beams ((20×10)÷50=4) is necessary. Accordingly, since irradiation needs to be performed while shifting the irradiation area, a problem exists such that there are regions irradiated more than once and these regions have non-uniform crystal grains. Moreover, throughput is reduced, thus there exists another problem such that production costs become high.

On the other hand, the RTA can form the polycrystalline silicon film with uniform crystal grains, so that formation of the TFT's comprising the pixel area is facilitated. However, in this method it is difficult to melt the amorphous silicon film, thereby crystal grains become small. Thus, there exists a problem such that the TFT's formed in the polycrystalline silicon film have low mobility and the threshold is non-uniform. That is, as described above it has been difficult to manufacture a monolithic liquid crystal display panel of a large area of 10 inches or over.

SUMMARY OF THE INVENTION

The invention has been achieved in view of the above problems. It is an object of the invention to provide a method of manufacturing a liquid crystal display panel in which a polycrystalline silicon film with larger crystal grains and a polycrystalline silicon film with uniform crystal grains can be selectively formed in accordance with a pixel area and each area of a peripheral circuit area, and a liquid crystal display panel with a large area and high-image quality is realized.

A method of manufacturing a liquid crystal display panel of the present invention wherein a pixel area and a peripheral circuit area including a horizontal scan area and a vertical scan area are formed in a polycrystalline semiconductor film on a substrate includes a step of forming an amorphous silicon film in regions corresponding to each area on the substrate, a step of poly-crystallizing the region corresponding to at least the horizontal scan area of the peripheral circuit area in the amorphous silicon film by performing annealing by means of irradiation of laser beams and a step of poly-crystallizing the region by performing annealing by means of lamp lights on the region except the region subject to the irradiation of the laser beams in the amorphous semiconductor film.

In a method of manufacturing a liquid crystal display panel of the invention, at least the amorphous silicon film of a region corresponding to the horizontal scan area of the peripheral circuit area becomes a polycrystalline semiconductor film with larger crystal grains by performing annealing by means of irradiation of laser beams. On the other hand, by performing annealing by means of lamplights an amorphous silicon film in the region not including the region subject to the irradiation of laser beams (that is, the pixel area, further including the vertical scan area) becomes a polycrystalline semiconductor film having uniform crystal grains. Thereafter, thin-film transistors with high mobility are formed in the horizontal scan area and the thin-film transistors having uniform properties are formed in the region not including the horizontal scan area.

Other and further objects, features and advantages of the invention will appear more fully from the following description.

DETAILED DESCRIPTION OF THE PREFERRED EMBODIMENTS

An embodiment of the present invention will be described in detail below with reference to the accompanying drawings.

Figure 3:
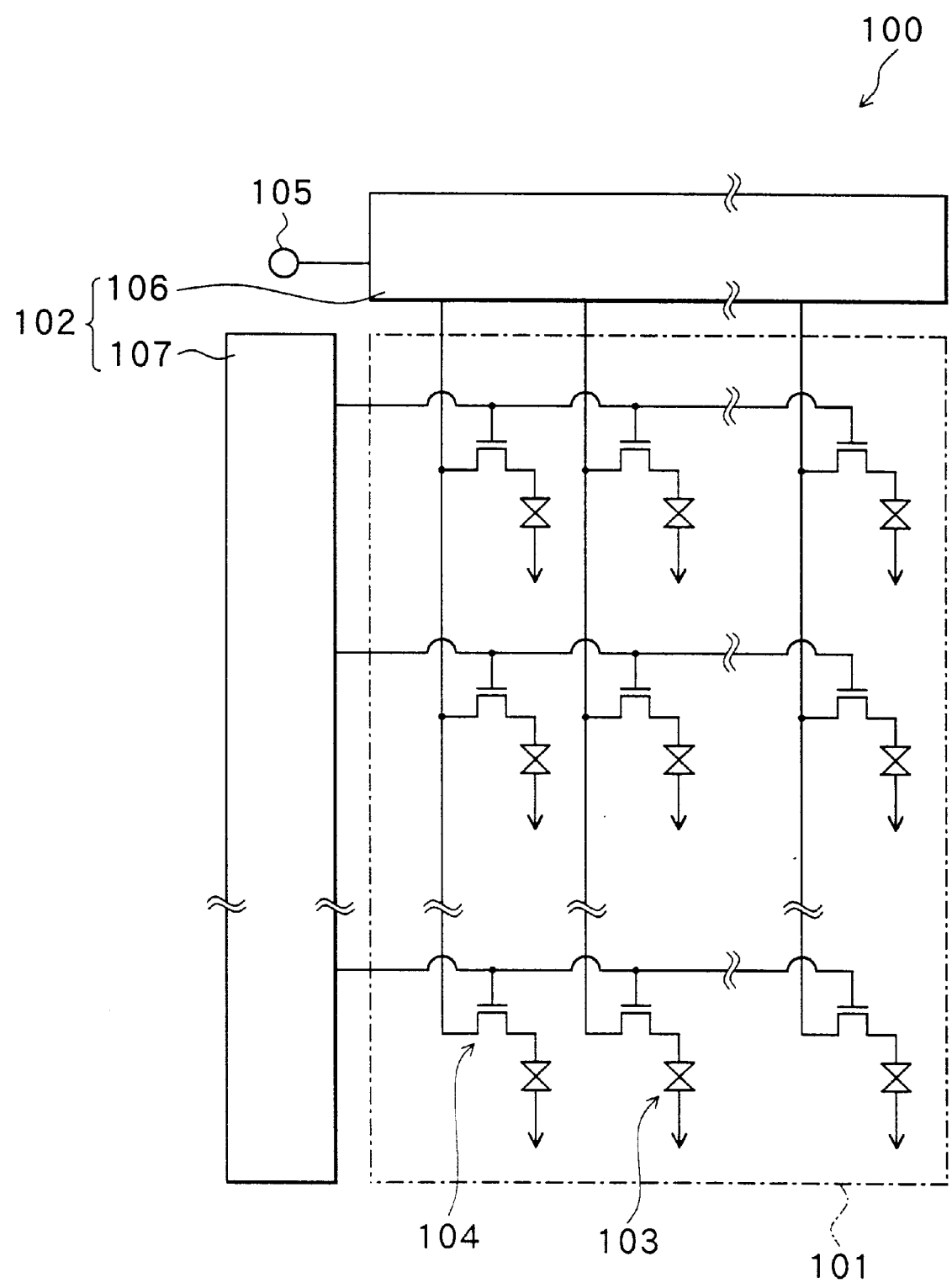
FIG. 3 is a block diagram showing the structure of a liquid crystal display panel schematically.

FIG. 3 shows a schematic circuit configuration of a liquid crystal display panel 100 according to an embodiment of the present invention. The liquid crystal display panel 100 includes a pixel area 101 and a peripheral circuit area 102 which is provided on the periphery of the pixel area 101 on a substrate (not shown) such as a glass substrate. Formed in the pixel area 101 are a crystal liquid layer 103 and a plurality of thin film transistors 104 arranged in matrix for driving the liquid crystal layer 103 in accordance with each pixel. The peripheral circuit area 102 having a video signal terminal 105 includes a horizontal scan area (horizontal scan circuit; signal electrode driving circuit) 106 for transmitting a horizontal scan signal along with an inputted image signal to the pixel area 101, and vertical scan area (vertical scan circuit; scan electrode driving circuit) 107 for transmitting a vertical scan signal to the pixel area 101.

In the liquid crystal display panel 100 the image signal is transmitted to the horizontal scan area 106 through the video signal terminal 105. The horizontal scan signal along with the image signal from the horizontal scan area 106 and the vertical scan signal from the vertical scan area 107 are transmitted to the thin-film transistors 104 corresponding to each pixel in the pixel area 101. Accordingly, switching in the liquid crystal layer 103 is controlled and thus image display is performed.

Next, a specific manufacturing method of a liquid crystal display panel in the embodiment will be described with reference to FIGS. 1 to 3.

Figure 1:
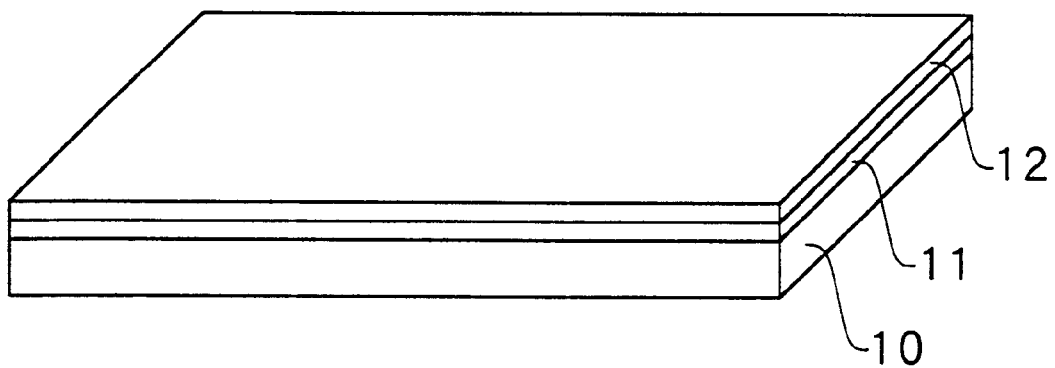
FIG. 1 is a perspective view describing a step of a method of manufacturing a liquid crystal display panel according to an embodiment of the present invention.

In the embodiment as illustrated in FIG. 1, a protecting film 11 with a thickness of 40 nm and an amorphous silicon film 12 with a thickness of, for example, 40 nm is sequentially formed on the whole surface of an insulating substrate 10 comprising, for example, a glass substrate. The protecting film 11 is formed, for example, by stacking a silicon dioxide ($SiO_2$) film of 30 nm in thickness and a silicon nitride (SiN) film of 10 nm in thickness in sequence for the purpose of preventing pollution from glass of the amorphous silicon film 12. The amorphous silicon film 12 is formed, for example, by a chemical vapor deposition (CVD) method, plasma enhanced chemical vapor deposition (PECVD) method, and sputter method. In the case where the plasma CVD method is employed, since the film deposited on the substrate includes hydrogen, annealing for removing hydrogen takes place. Specifically, the substrate is heated for 2 hours at a temperature of 450° C., for example. The annealing for removing hydrogen may be performed by RTA using ultraviolet rays U to be described later.

Figure 2A:
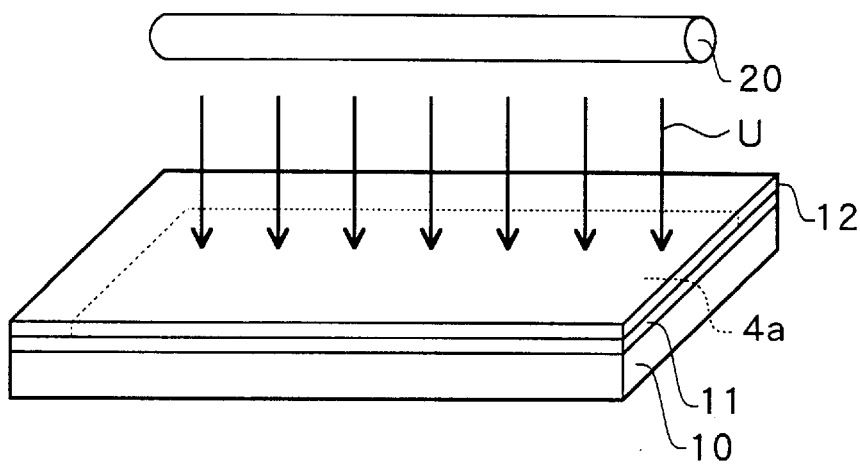
FIG. 2A is a perspective view describing a step of the method of manufacturing a liquid crystal display panel following the step of FIG. 1.

After depositing the amorphous silicon film 12, the amorphous silicon film 12 is crystallized. In the embodiment a region 4a intended for pixel area formation, and a region 2a intended for horizontal scan area formation and a region 3a intended for vertical scan area formation are crystallized using different methods. That is, as shown in FIG. 2A, first RTA is performed on the region 4a in the amorphous silicon film 12, for example, at a temperature of 900° C. for five seconds. This RTA is performed, for example, using an ultraviolet ray lamp 20 by uniformly irradiating ultraviolet rays U. In the region where the ultraviolet rays U have been irradiated by RTA, the amorphous silicon does not melt but crystallizes in a solid phase to become a polycrystalline silicon film. Moreover, according to the RTA since the ultraviolet rays U are uniformly irradiated on the region 4a, a polycrystalline silicon film with uniform crystal grains is formed.

Figure 2B:
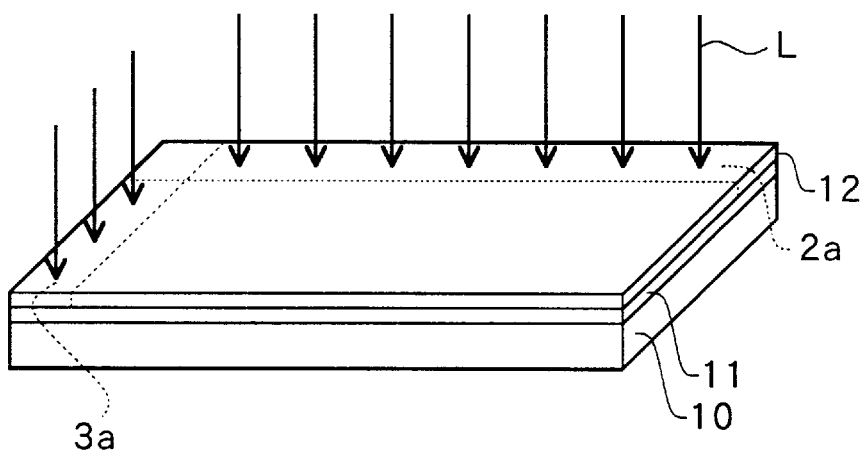
FIG. 2B is a perspective view describing a step of the method of manufacturing a liquid crystal display panel following the step of FIG. 2A.

On the other hand, on the region 2a and the region 3a, as shown in FIG. 2B an excimer laser L of the same shape of the region 2a and the region 3a is irradiated by the large-area ELA.

According to the large-area ELA, XeCl excimer laser (308 nm) with energy: 10 J and over and pulse frequency: ⅙ Hz and greater is generated using an X-ray reserve ionization method, for example. The excimer laser is converted into a line beam or a long and narrow shaped beam using an optical apparatus. The line beam or the long and narrow shaped beam has a beam profile of uniformly existing in a space of 0.4 cm×40 cm and is irradiated 20 shots under the condition of energy density 550 mJ/cm$^2$, for example. The amorphous silicon is melted and crystallized in the region where the excimer laser L has been irradiated by the large-area ELA.

Figure 2C:
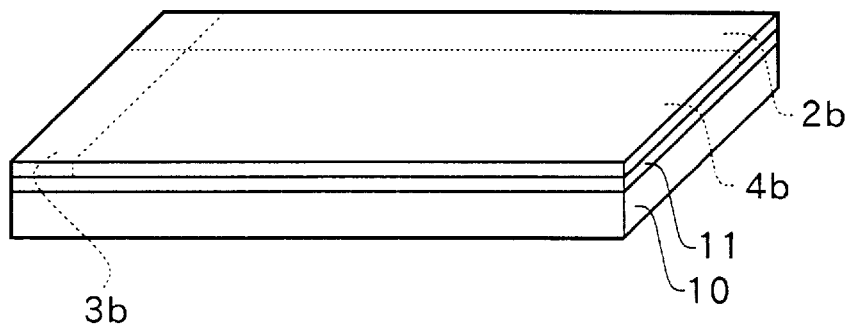
FIG. 2C is a perspective view describing a step of the method of manufacturing a liquid crystal display panel following the step of FIG. 2B.

By performing such RTA and large-area ELA, polycrystalline silicon films 4b, 2b and 3b are formed in the region 4a, the region 2a and the region 3a, respectively as shown in FIG. 2C. Thereafter, similar to the conventional technique, steps for TFT formation, steps for manufacturing a liquid crystal display panel and the like are performed. These steps include formation of a gate oxidation film after separating devices, formation of a source region and a drain region after formation of a gate electrode, formation of a layer insulating film, formation of a contact hole, formation of metal wiring and indium-tin oxide (ITO), and sealing of liquid crystal. After undergoing these steps, the liquid crystal display panel of the embodiment is completed.

Incidentally, the crystal property of the polycrystalline silicon film formed by RTA is inferior to that formed by large-area ELA. However, when the TFT's are formed using the polycrystalline silicon film formed by RTA, electron mobility of these TFT's is superior to that of the TFT's formed using hydrogenated amorphous silicon film (a-Si:H). Besides, when grain size of the polycrystalline silicon formed by the large-area ELA under the aforementioned condition is measured, it is confirmed that the maximum value of diameters of all grains measured is 1 μm and greater.

As described in the embodiment above the amorphous silicon film 12 for the region 4a becomes the polycrystalline silicon film 4b having a uniform crystal property by performing RTA, thereby making it possible to form uniform TFT's with a large area in the pixel area. On the other hand, since the polycrystalline silicon films 2b and 3b have larger crystal grains in the region 2a and the region 3a due to the large-area ELA, it is possible to form TFT's with high mobility in the horizontal scan area and the vertical scan area.

Although the present invention has been described above by exemplifying the embodiment, the present invention is not limited to the embodiment and various modifications are possible. For example, although in the above embodiment the case such that amorphous silicon (Si) is poly-crystallized is described, not only a single layer structure of silicon but also a structure stacking a silicon film on a silicon germanium (SiGe) film may be possible.

Furthermore, when other circuits such as a function circuit or the like is mounted on one liquid crystal display panel (system-on-glass), large-area ELA is performed thereon including the circuits or large-area ELA is separately performed on the circuit. Furthermore, insulating substrate 10 can be made of other materials than glass.

Although in the above embodiment, crystallization by means of the excimer laser L is performed on each of the horizontal scan area and the vertical scan area, it is possible that only the horizontal scan region is subject to the excimer laser L and RTA is performed on the vertical scan area along with the pixel area to be crystallized. This is because the horizontal scan area with a wide scan range requires TFT properties of especially high mobility, but the vertical scan area does not require such TFT properties of high mobility as the horizontal scan area does.

As described above according to the method of manufacturing a liquid crystal display panel of the present invention, at least the horizontal scan area of the peripheral circuit area is crystallized by irradiating a laser beam and the region except the horizontal scan area is crystallized by irradiating lamp lights, so that the polycrystalline semiconductor film with larger sized crystal grains is formed in the horizontal scan area and the polycrystalline semiconductor film with crystal grains of uniform size in the region except the horizontal scan area. Accordingly, formed in the horizontal scan area are the thin-film transistors with high electron mobility and uniform threshold, and formed in the region except the horizontal scan area including the pixel area are the thin-film transistors with uniform properties. More specifically, thin-film transistors having properties satisfying the requirement for each area are easily formed in respective areas, thereby making it possible to manufacture a large-area liquid crystal display panel, 10 inches or over with high-image quality.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a liquid crystal display panel wherein a pixel area, and a peripheral circuit area including a horizontal scan area and a vertical scan area are formed in a polycrystalline semiconductor film on a substrate, the method comprising the steps of:

forming an amorphous silicon film in regions corresponding to each area on the substrate;

poly-crystallizing the amorphous silicon film in the region corresponding to the horizontal scan area by performing annealing by means of irradiation of excimer laser beams having an energy of at least 10 J and a pulse frequency of at least ⅙ Hz;

poly-crystallizing the amorphous silicon film in the region corresponding to the pixel area by performing annealing by means of lamp lights; and poly-crystallizing the amorphous silicon film in the region corresponding to the vertical scan area by performing annealing by means of irradiation of excimer laser beams having an energy of at least 10 J and a pulse frequency of at least ⅙ Hz or lamp lights.

2. A method of manufacturing a liquid crystal display panel according to claim 1, wherein the annealing by means of the lamp lights is performed using an ultraviolet ray lamp.

* * * * *